United States Patent [19]

Cote

[11] Patent Number: 4,850,920

[45] Date of Patent: Jul. 25, 1989

[54] MACHINE FOR INSERTING CATHODES IN CATHODE TUBE GUNS

[75] Inventor: Daniel Cote, Ampuis Condrieu, France

[73] Assignee: Videocolor, Montrouge, France

[21] Appl. No.: 169,952

[22] Filed: Mar. 18, 1988

[30] Foreign Application Priority Data

Mar. 20, 1987 [FR] France ................................ 87 03922

[51] Int. Cl.⁴ ............................ H01J 9/42; H01J 9/18

[52] U.S. Cl. ........................................ 445/63; 73/37.5; 445/67

[58] Field of Search ........................ 445/67, 34, 36, 63; 73/37.5, 37.9; 33/143 R, 143 G, DIG. 2

[56] References Cited

U.S. PATENT DOCUMENTS

| | | | |
|---|---|---|---|
| 1,860,640 | 5/1932 | Witchger | 33/143 G |
| 2,864,935 | 12/1958 | Johnson et al. | 445/3 |
| 2,869,243 | 1/1959 | Byrkett et al. | 33/DIG. 2 |
| 3,533,147 | 10/1970 | Baur et al. | 73/37.5 |
| 3,584,182 | 5/1969 | Volk et al. | 73/37.5 X |
| 3,848,301 | 11/1974 | Gruber | 445/34 |
| 4,015,315 | 4/1977 | Stone | 445/34 |
| 4,449,951 | 5/1984 | Nill | 445/34 |

FOREIGN PATENT DOCUMENTS 2205738 5/1974 France .

OTHER PUBLICATIONS

RCA Technical Notes, No. 1322, Dec. 1982, pp. 1,2, New Jersey, US: R. E. Schlack et al.: "G1-G2 Compensating Cathode Inserter".

*Primary Examiner*—Kenneth J. Ramsey
*Attorney, Agent, or Firm*—Oblon, Spivak, McClelland, Maier & Neustadt

[57] ABSTRACT

The cathode-inserting machine of the invention has a gun carriage, movable between two stops under the effect of a jack, a retractable sensor and a cathode support. The overall length of the sensor is equal to the travel of the carriage. It is thus enough to measure the distance between the sensor and the cathode when the carriage is at the rear stop and then to move it forward to the front stop in order to position the cathode exactly in its eyelet.

4 Claims, 3 Drawing Sheets

MACHINE FOR INSERTING CATHODES IN CATHODE TUBE GUNS

BACKGROUND OF THE INVENTION

1. Field of the Invention

The present invention pertains to a machine for inserting a cathode in a cathode tube gun.

2. Description of the Prior Art

Machines currently used to insert electron gun cathodes for cathode tubes measure the distance between the active side of these cathodes and the grid 1 (or the grid 2 as the case may be) with complicated, slow instruments which have difficulty in maintaining necessary precision.

For these machines position the cathode with respect to the grid 1 by first interposing a sensor of a fixed length between the cathode and the grid 1. The cathode is placed on a fixed support and the gun is placed on a movable support driven by a wheel which works with a cam-shaped groove of a leading screw which is itself driven by a stepping motor.

A first stopping stage of this groove determines the measuring position and position-setting of the cathode. Then the gun is drawn back, the sensor is released and the gun is brought forward by a distance equal to the distance by which it has been moved back plus the length of the sensor, and reaches the position where the cathode is soldered to the gun eyelet. This position too is determined by a stopping stage of the groove. Thus any modification in the setting of the machine means that the sensor has to be dismantled and machined to new dimensions. The device for driving the leading screw and the wheel is not precise: for example, the groove of the leading screw should be free of dust and debris but this is difficult to achieve in a factory environment. Even if the stepping motor stops precisely in the desired angular position, the device for coupling with the leading screw, that it drives, has backlash which is difficult to take into account. The forces exerted on the wheel, both by the gun carriage and the leading screw, cause the backlash in this transmission of motion to be reflected at the carriage. Furthermore, if the cathode eyelet is out of axis, the sensor may deform the eyelet unless the sensor itself is made of a deformable material.

An object of the present invention is a fast, precise and reliable method to insert a cathode in a cathode tube gun, where the rod of the sensor does not have to be deformable but yet in no way deforms the eyelet of the cathode.

SUMMARY OF THE INVENTION

The machine of the invention, for inserting a cathode in a gun eyelet, has a movable supporting device for the gun. This movable supporting device shifts the gun in the direction of its axis and moves between two fixed positions. The machine of the invention further has a sensor with a retractable rod, which can be shifted perpendicularly to the axis of the gun.

According to an embodiment of the invention, the sensor has a cylinder in which a piston moves. A sensing rod is fixed to this piston. This sensing rod comes out of a first end of the cylinder and is designed to come into contact with the first grid of the gun. The other end of the cylinder has a measuring device which, when the sensor is placed in the axis of the gun and the piston abuts the rod exit end, measures the distance from the active side of a cathode which is also placed in the axis of the gun.

BRIEF DESCRIPTION OF THE DRAWINGS

The present invention will be better understood from the following detailed description of an embodiment, given as a non-restrictive example and illustrated by the appended drawings, of which.

DESCRIPTION OF A PREFERRED EMBODIMENT

Figure 1:
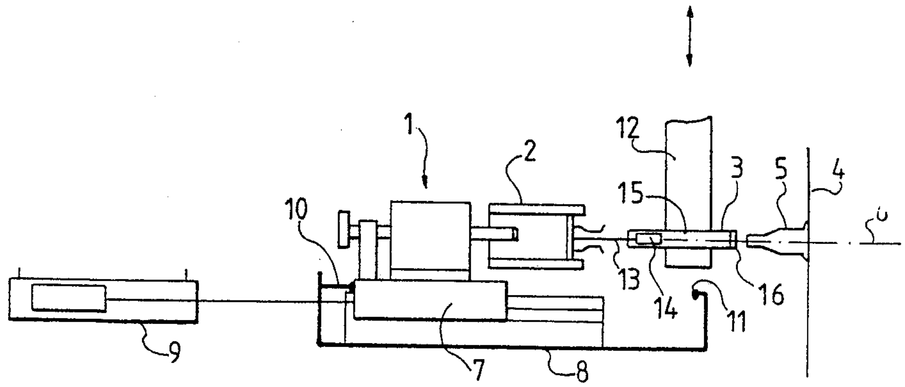
FIG. 1 shows a simplified side view of a machine according to the invention.

The machine shown schematically in FIG. 1 has a movable supporting device 1 for an cathode tube electron gun 2, a sensor 3 with a retractable rod and a device 4 to support the cathode 5. In the measuring position, as shown in FIG. 1, the sensor 3 and the cathode 5 are placed in the axis 6 of the gun. The supporting device 1 shifts the gun 2 always along its axis 6.

The supporting device 1 has a carriage 7 which carries the gun 2 in a manner known per se . The carriage 7 moves on a sliding device 8 under the effect of a jack 9. The device 8 has two adjustable stops 10, 11, which respectively determine a rear fixed position and a front fixed position. As will be explained in greater detail below, the machine cycle has only two carriage 7 movements, namely from the stop 10 to the stop 11 and back, while the cycle of the prior art machine had four movements determined by a leading screw.

The sensor 3, which has a generally cylindrical shape, is mounted on a supporting device 12 which is movable perpendicularly to the axis 6 between a measuring position, where the axis of the sensor is the same as the axis 6, as shown in FIG. 1, and a disengaged position. The sensor 3 essentially has a retractable measuring rod 13, moved by a piston 14 which moves in the chamber formed by the cylindrical casing 15 of the sensor and, at the other end, a distance-measuring device 16. In the measuring position, this distance-measuring device 16 faces the active side of the cathode 5. In the disengaged position, the measuring rod 13 of the sensor is retracted. When the sensor 3 reaches the measuring position, its rod is brought out so as to come into contact with the first grid G1 of the gun 2.

Figure 2:
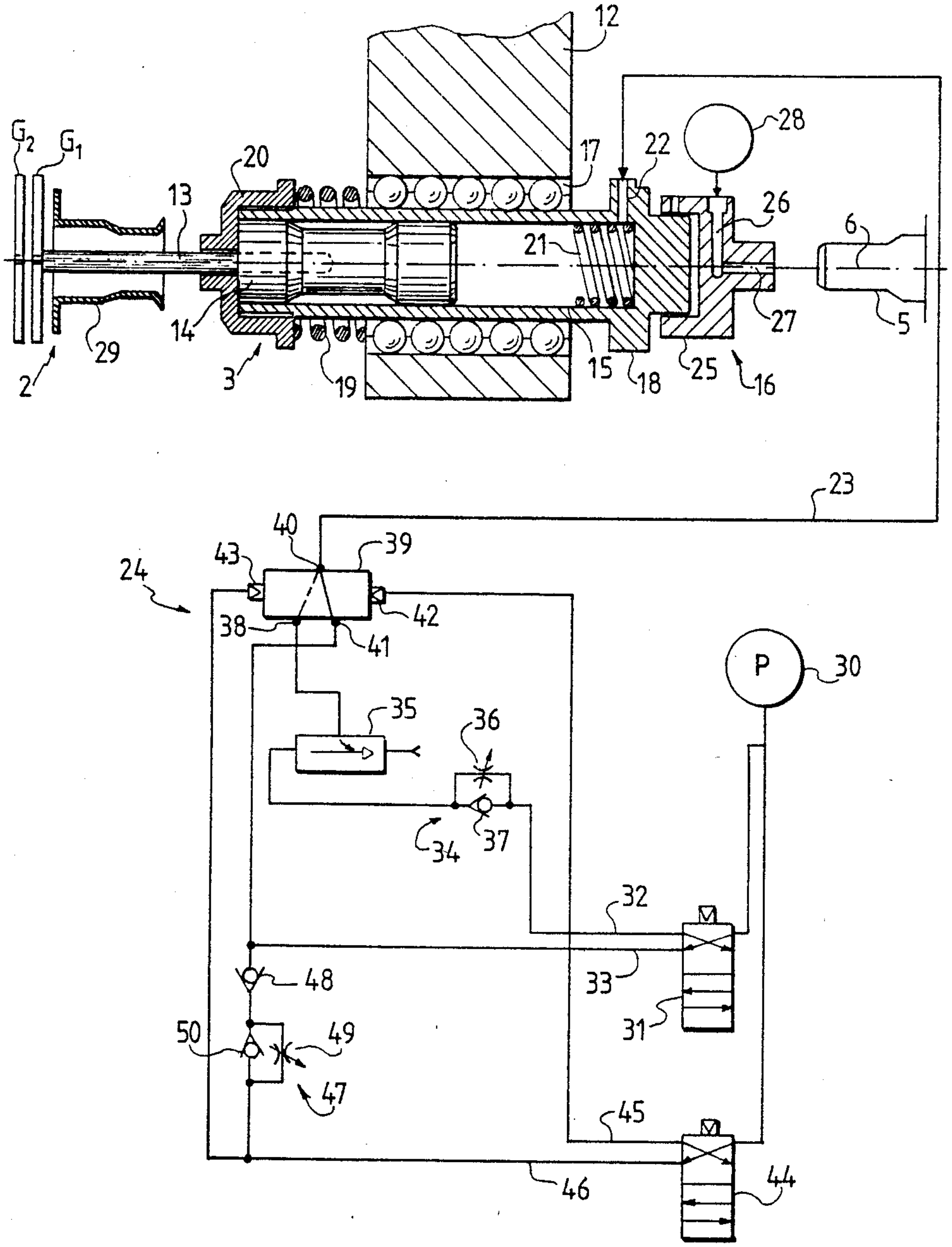
FIG. 2 shows a cross-section of the sensor of FIG. 1 with its pneumatic control device; and, FIG. 3 shows a set of cross-section views of the feeler of FIGS. 1 and 2 at different stages in its operation.

We shall now give a more detailed description of the measurement sensor 3 and its actuating device with reference to FIG. 2, where the sensor is shown in the measuring position. The sensor device described herein is of the pneumatic control type, but it is obvious that the invention is not restricted to a sensor of this type, and that any sensor that fulfills the same function (with a retractable rod to measure the distance between the first grid of the gun and the cathode) can be used: for example, sensors controlled electromagnetically, hydraulically or otherwise.

The casing 15 of the sensor 3 is mounted so that it can move in axial translation with respect to its support 12 through a ball bearing 17. This translation is limited on one side (the device 16 side) by a shoulder 18 of the casing 15 and, on the other side, by a helical spring 19 set around the casing 15 and pressing against a screw cap 20, screwed into the end of the casing 15. This screw cap 20 lets through the rod 13 non-hermetically and acts as an adjustable stop for the piston 14. The other end of the casing 15 is closed and a helical spring 21, placed inside the casing 15, presses against this closed end and prevents the piston 14 from abutting this end too suddenly in its withdrawal movement.

The casing 15 of the sensor is drilled, near the end on which the spring 21 is supported, with a radial hole 22 connected by a conduit 23 to a pneumatic control device 24. A cap 25 is screwed (with the possibility of being adjusted) onto this end. This cap 25 is drilled with a radial hole 26 that communicates with a calibrated axial hole 27 which opens out in front of the cathode 5. The hole 26 is connected to a measuring device 28 (not shown in detail) with an air gauge and a pneumatic pressure source of a type known per se .

As shown in FIG. 2, in the measuring position, the piston 14 abuts the screw cap 20, its rod 13 being supported against the first grid G1 of the gun 2. For this gun 2, the figure shows, in addition to G1, only the second grid G2 and the cathode eyelet 29, in which the cathode 5 has to be welded after adjusting its distance from the grid G1. This distance can be adjusted, for example by the axial displacement of the cathode or the gun, so as to obtain a determined value with the device 28. Thus the length of the sensor 3 (from the end of the rod 13, with the piston 14 abutting the screw cap 20, up to the opening of the hole 27) being equal to the travel of the carriage 7 between the stops 10 and 11, the distance between the opening of the hole 27 and the active side of the cathode 5 is adjusted by means of the measuring device 28 so that it is equal to the distance sought between the grid G1 and this active side of the cathode 25.

We shall now describe the control device 24. This device 24 has a pneumatic high pressure source 30 connected by a first inverter 31, either to a conduit 32 or to a conduit 33. The conduit 32 is connected by a delivery-rate adjusting device 34 to the inlet of a Venturi tube device 35. The device 34 has an adjustable necking 36 in parallel with a nonreturn valve 37. The flowing direction in this nonreturn valve is 35 towards 32. The air suction outlet of the Venturi tube device 35 is connected to a first inlet 38 of a pneumatic slide valve 39, the outlet 40 of which is connected to the hole 22 of the sensor 3. The conduit 33 is directly connected to the second inlet 41 of the slide valve 39.

The slide valve 39 has two control inlets 42, 43. When the inlet 42 receives pneumatic high pressure, the inlet 38 is made to communicate with the outlet 40, and when the inlet 43 receives this high pressure, it is the inlet 41 that is made to communicate with the outlet 40.

The source 30 is also connected, by a second inverter 44, either to a conduit 45 or to a conduit 46. The conduit 45 is directly connected to the control inlet 43 of the slide valve 39. The conduit 46 is connected, on the one hand, directly to the control inlet 43 and, on the other hand, to the inlet 41 by a delivery-rate adjusting device 47 followed by a nonreturn valve 48. The device 47 has an adjustable necking 49 in parallel with a nonreturn valve 50. The flowing directions in the valves 48 and 50 are the directions 46 to 41 and 41 to 46 respectively.

Figure 3:
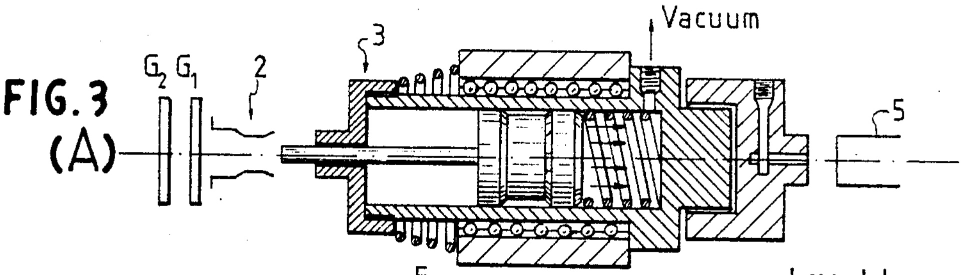
Figure 3:
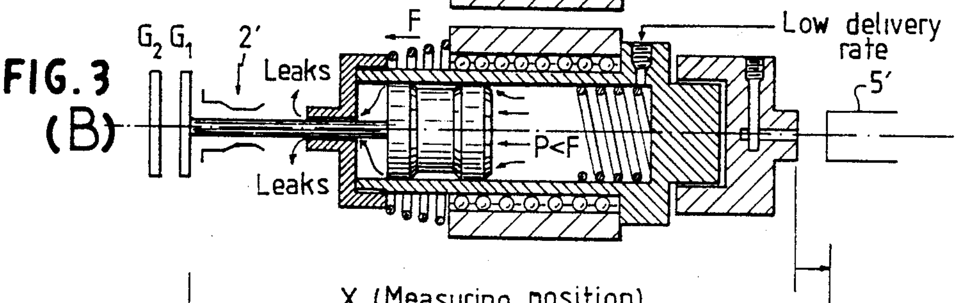
Figure 3:
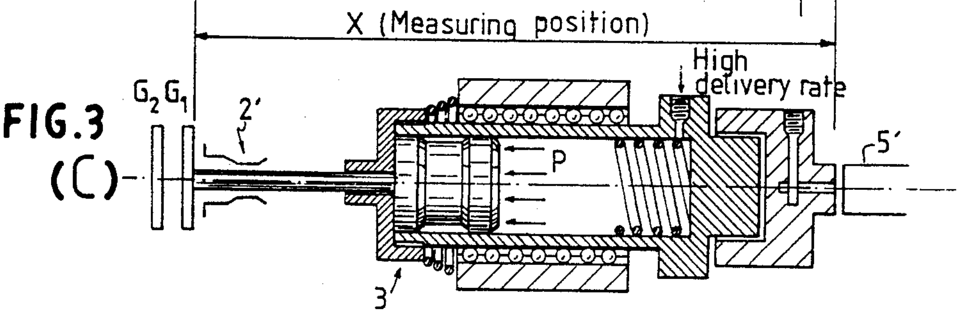
Figure 3:
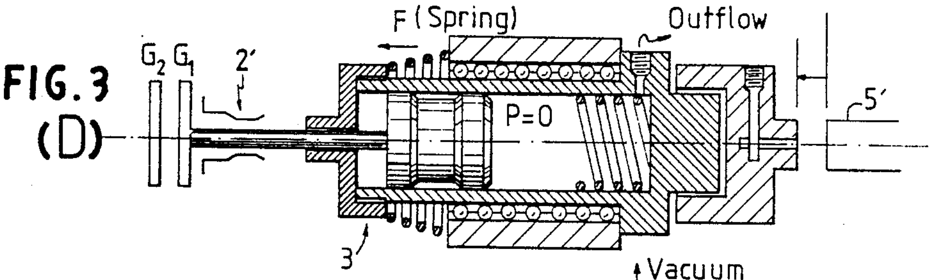
Figure 3:
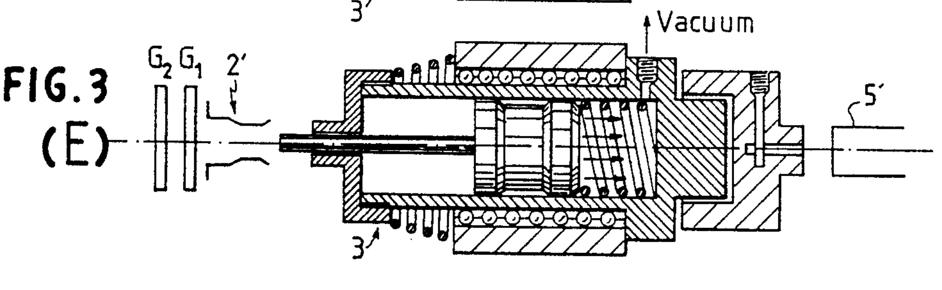

Referring to FIGS. 2 and 3, we shall now give a detailed explanation of the working of the sensor 3 and its control device 24. With the sensor 3 in the measuring position, at the end of the measurement the two inverters 31 and 44 are actuated by a device (not shown) so that they are in the reverse position to that shown in FIG. 2. In other words, the source 30 is made to communicate with the conduits 32 and 45. The slide valve 39, actuated by the control inlet 42, is in the position shown with dashes in FIG. 2, i.e. it makes 38 communicate with 40. The high pressure arriving through the conduit 32 goes through 34 and creates a depression at the outlet of the Venturi tube device 35. This depression is transmitted to the hole 22 of the sensor. This depression therefore makes the piston 14 go back. The speed of this return motion of the piston 14 depends on the setting of 36. The piston 14 goes back until it makes contact with the spring 21 which cushions the end of its travel. At the end of this stage, the sensor 3 is in the position shown in A in FIG. 3. The sensor is then released by a withdrawal motion of its support 12. The carriage 7, which was supported against the stop 10, is actuated by the jack 9 and is pressed against the stop 11. The cathode 5 is thus inserted into the eyelet 29 and is soldered to it, for example by a laser soldering device (not shown). The gun 2 is removed by a handling device (not shown) and replaced by another gun 2′ without any cathode, and another cathode 5′ is placed on the support 4.

The position of the inverter 44 alone is modified, and it then makes the source 30 communicate with the conduit 46. The pressure of the source 30 is still sent to the Venturi tube device 35 through the device 34 but, since the slide valve 39 changes its state (for the inverter 44 changes its state), the depression created by the Venturi has no effect on the sensor. Furthermore, the pressure of the source 30, which is sent to the conduit 46, reaches the control inlet 43 and, therefore, makes the slide valve 39 change its state, as has just been described. Furthermore, the pressure that comes through the conduit 46 goes through the device 47 and the valve 48 and therefore reaches the hole 22, through 41, 40 and 23, at a low delivery rate. This pneumatic low pressure pushes the piston 14 towards the screw cap 20 but, since the air flow from the hole 40 is adjusted (by the element 49) so as to be slightly smaller than the leaks in the passage of the rod 13 in the screw cap 20, the movement of the piston is relatively slow and its rod 13 meets the grid G1 gently when the piston 14 has not yet come to a stop against the cap 20 (FIG. 3, line B).

Then, the state of the inverter 31 is reversed without modifying the state of the inverter 44. The high pressure of the source 30 then goes through the conduit 33 and, from there, it reaches the sensor through 40 and 41. The air delivery rate is then substantially greater than the said leaks, and this pushes the piston 14 until it abuts the cap 20. Since the rod 13 is stopped against G1, it can no longer go forward. This forces the casing 15 of the sensor to move back (towards the cathode) compressing the spring 19. The sensor 3 is then in the position shown in line C of FIG. 3. An automatic micrometrical screw setting device (not shown) moves the gun 2′ with respect to its supporting carriage 4 so as to obtain the desired set value, i.e. the desired distance between G1 and the cathode (this set value may be a zero setting for example), with the measuring device 28.

Then, the position of the inverter 44 is changed without modifying that of the inverter 31. The source 30 then communicates with the control inlet 42. This actuates the slide valve 39 and makes 38 and 40 communicate. The conduit 33 is thus blocked at 41, and the source 30 communicates neither with 38 nor with 41. The inlet 38 comes under ambient atmospheric pressure through the Venturi tube device 31. This makes the compressed air contained in the casing 15 of the sensor escape outwards. The spring 19 expands and pushes the sensor towards the gun 2', since the rod 13 is still stopped against G1. The sensor is then in the position shown in line D of FIG. 3, i.e. in practically the same position that it had when air was sent at a low delivery rate (line B of FIG. 5).

Finally, the position of the inverter 31 is inverted without modifying the position of the inverter 44. Thus there is a return to the starting position where a depression was created in the casing 15 of the sensor. The piston 14 therefore goes back towards the cathode 5', and the sensor is in the position shown in line E, FIG. 3, i.e. at the same position as in line A of this figure, and the cycle described above is started again.

According to a preferred embodiment, the rod 13 of the sensor 3 is made of a hardened metal or alloy; it is precision-ground and does not get deformed. If an eyelet is out of axis or off-centered, the rod does not get deformed and is retracted, for the eyelet then offers sufficient resistance to the pressure exerted by the piston and does not get deformed. Preferably, the machine has an appropriate sensor (not shown) that detects this anomaly (for example through the premature withdrawal of the rod) and triggers off an alarm and/or actuates a device to eject the defective gun.

What is claimed is:

1. A machine for inserting a cathode in a cathode tube gun eyelet, comprising a movable supporting device for supporting the gun, said movable supporting device shifting said gun in the direction of its axis and being movable between two fixed positions, and a sensor with a retractable rod said sensor being shifted perpendicularly to the axis of the gun by said rod, said sensor comprising a cylinder containing a piston which moves therein and a sensing rod fixed to said piston, said sensing rod extending from a first end of the cylinder to contact the first grid of the gun.

2. A machine according to claim 1, wherein the other end of the cylinder having a measuring device for measuring the distance to the active side of a cathode, said cathode being in the axis of the gun when the sensor is placed in the axis of the gun and the piston abuts the rod exit end.

3. A machine according to claim 2 wherein the length of the sensor, when the piston is stopped against said first end of the cylinder, is equal to the distance by which the movable support of the gun moves between said two fixed positions.

4. A machine for inserting a cathode in a cathode tube gun eyelet, comprising a movable supporting device for supporting the gun, said movable supporting device shifting said gun in the direction of its axis and being movable between two fixed positions, and a sensor with a retractable rod, said sensor being shifted perpendicularly to the axis of the gun by said rod, further comprising a pneumatic control device for controlling said sensor by successively sending said sensor a depression, air a low delivery rate, air at a high delivery rate and ambient atmospheric pressure.

* * * * *